United States Patent
Raring et al.

(10) Patent No.: US 10,096,973 B1
(45) Date of Patent: Oct. 9, 2018

(54) LASER DIODES WITH AN ETCHED FACET AND SURFACE TREATMENT

(71) Applicant: Soraa Laser Diode, Inc., Goleta, CA (US)

(72) Inventors: James W. Raring, Goleta, CA (US); Matthew Schmidt, Goleta, CA (US); Bryan Ellis, Goleta, CA (US)

(73) Assignee: Soraa Laser Diode, Inc., Goleta, CA (US)

(*) Notice: Subject to any disclaimer, the term of this patent is extended or adjusted under 35 U.S.C. 154(b) by 0 days.

(21) Appl. No.: 15/453,839

(22) Filed: Mar. 8, 2017

Related U.S. Application Data

(63) Continuation of application No. 14/878,387, filed on Oct. 8, 2015, now Pat. No. 9,608,407, which is a continuation of application No. 14/010,326, filed on Aug. 26, 2013, now Pat. No. 9,184,563.

(60) Provisional application No. 61/695,276, filed on Aug. 30, 2012.

(51) Int. Cl.
| | |
|---|---|
| *H01S 5/00* | (2006.01) |
| *H01S 5/22* | (2006.01) |
| *H01S 5/02* | (2006.01) |
| *H01S 5/323* | (2006.01) |
| *H01S 5/343* | (2006.01) |
| *H01S 5/32* | (2006.01) |
| *H01S 5/10* | (2006.01) |

(52) U.S. Cl.
CPC ............ *H01S 5/22* (2013.01); *H01S 5/0203* (2013.01); *H01S 5/1082* (2013.01); *H01S 5/2201* (2013.01); *H01S 5/3202* (2013.01); *H01S 5/32341* (2013.01); *H01S 5/34333* (2013.01); *H01S 5/0202* (2013.01); *H01S 2301/02* (2013.01); *H01S 2301/17* (2013.01)

(58) Field of Classification Search
CPC ...... H01S 5/22; H01S 5/1082; H01S 5/34333; H01S 5/32341; H01S 5/3202; H01S 5/0203; H01S 5/2201; H01S 5/0202; H01S 2301/17; H01S 2301/02
See application file for complete search history.

(56) References Cited

U.S. PATENT DOCUMENTS

| | | | |
|---|---|---|---|
| 4,341,592 | A | 7/1982 | Shortes et al. |
| 4,860,687 | A | 8/1989 | Frijlink |
| 4,911,102 | A | 3/1990 | Manabe et al. |
| 5,331,654 | A | 7/1994 | Jewell et al. |
| 5,527,417 | A | 6/1996 | Iida et al. |
| 5,607,899 | A | 3/1997 | Yoshida et al. |
| 5,608,749 | A | 3/1997 | Kizuki |

(Continued)

FOREIGN PATENT DOCUMENTS

| | | |
|---|---|---|
| JP | 03287770 | 12/1991 |
| JP | 2007173467 | 7/2007 |

OTHER PUBLICATIONS

Founta et al., Anisotropic Morphology of Nonpolar a-Plan GaN Quantum Dots and Quantum Wells, Journal of Applied Physics, vol. 102, No. 7, 2007, pp. 074304-1-074304-6.

(Continued)

*Primary Examiner* — Yuanda Zhang
(74) *Attorney, Agent, or Firm* — Kilpatrick Townsend & Stockton LLP

(57) ABSTRACT

A gallium- and nitrogen-containing laser device including an etched facet with surface treatment to improve an optical beam is disclosed.

20 Claims, 17 Drawing Sheets

(56) References Cited

U.S. PATENT DOCUMENTS

| | | | |
|---|---|---|---|
| 5,627,851 A * | 5/1997 | Takahashi | H01S 5/0207 372/108 |
| 5,632,812 A | 5/1997 | Hirabayashi | |
| 5,647,945 A | 7/1997 | Matsuse et al. | |
| 5,888,907 A | 3/1999 | Tomoyasu et al. | |
| 5,951,923 A | 9/1999 | Horie et al. | |
| 6,547,249 B2 | 4/2003 | Collins, III et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,814,811 B2 | 11/2004 | Ose | |
| 7,009,199 B2 | 3/2006 | Hall | |
| 7,303,630 B2 | 12/2007 | Motoki et al. | |
| 7,312,156 B2 | 12/2007 | Granneman et al. | |
| 7,390,359 B2 | 6/2008 | Miyanaga et al. | |
| 7,483,466 B2 | 1/2009 | Uchida et al. | |
| 7,489,441 B2 | 2/2009 | Scheible et al. | |
| 7,749,326 B2 | 7/2010 | Kim et al. | |
| 7,806,078 B2 | 10/2010 | Yoshida | |
| 8,247,887 B1 | 8/2012 | Raring et al. | |
| 8,314,429 B1 | 11/2012 | Raring et al. | |
| 8,350,273 B2 | 1/2013 | Vielemeyer | |
| 8,494,017 B2 | 7/2013 | Sharma et al. | |
| 8,524,578 B1 | 9/2013 | Raring et al. | |
| 9,184,563 B1 | 11/2015 | Raring et al. | |
| 9,608,407 B1 | 3/2017 | Raring et al. | |
| 2002/0027933 A1 | 3/2002 | Tanabe et al. | |
| 2003/0000453 A1 | 1/2003 | Unno et al. | |
| 2003/0001238 A1 | 1/2003 | Ban | |
| 2003/0020087 A1 | 1/2003 | Goto et al. | |
| 2003/0200931 A1 | 10/2003 | Goodwin | |
| 2004/0099213 A1 | 5/2004 | Adomaitis et al. | |
| 2005/0229855 A1 | 10/2005 | Raaijmakers | |
| 2006/0060131 A1 | 3/2006 | Atanackovic | |
| 2006/0086319 A1 | 4/2006 | Kasai et al. | |
| 2006/0144334 A1 | 7/2006 | Yim et al. | |
| 2006/0216416 A1 | 9/2006 | Sumakeris et al. | |
| 2007/0093073 A1 | 4/2007 | Farrell, Jr. et al. | |
| 2007/0280320 A1 | 12/2007 | Feezell et al. | |
| 2008/0164578 A1 | 7/2008 | Tanikella et al. | |
| 2008/0198881 A1 | 8/2008 | Farrell et al. | |
| 2008/0217745 A1 | 9/2008 | Miyanaga et al. | |
| 2008/0251020 A1 | 10/2008 | Franken et al. | |
| 2008/0283851 A1 | 11/2008 | Akita | |
| 2008/0298409 A1 | 12/2008 | Yamashita et al. | |
| 2009/0229519 A1 | 9/2009 | Saitoh | |
| 2009/0250686 A1 | 10/2009 | Sato et al. | |
| 2010/0006873 A1 | 1/2010 | Raring et al. | |
| 2010/0195687 A1 | 8/2010 | Okamoto et al. | |
| 2010/0220262 A1 | 9/2010 | Demille et al. | |
| 2010/0309943 A1 | 12/2010 | Chakraborty et al. | |
| 2010/0316075 A1 | 12/2010 | Raring et al. | |
| 2011/0075694 A1 | 3/2011 | Yoshizumi et al. | |
| 2011/0180781 A1 | 7/2011 | Raring et al. | |
| 2011/0247556 A1 | 10/2011 | Raring et al. | |
| 2013/0016750 A1 | 1/2013 | Raring et al. | |
| 2013/0230067 A1 | 9/2013 | Eichler et al. | |

OTHER PUBLICATIONS

Sato et al., Optical Properties of Yellow Light-Emitting-Diodes Grown on Semipolar (1122) Bulk GaN Substrate, Applied Physics Letter, vol. 92. No 22, 2008, pp. 221110-1-221110-3.

U.S. Appl. No. 12/491,169, Final Office Action dated May 11, 2011, 10 pages.

U.S. Appl. No. 12/491,169, Non-Final Office Action dated Oct. 22, 2010, 10 pages.

U.S. Appl. No. 12/497,289, Non-Final Office Action dated Feb. 2, 2012, 7 pages.

U.S. Appl. No. 12/497,289, Notice of Allowance dated May 22, 2012, 7 pages.

U.S. Appl. No. 12/880,803, Non-Final Office Action dated Feb. 22, 2012, 9 pages.

U.S. Appl. No. 12/880,803, Notice of Allowance dated Jul. 18, 2012, 5 pages.

U.S. Appl. No. 12/995,946, Final Office Action dated Aug. 2, 2013, 16 pages.

U.S. Appl. No. 12/995,946, Non-Final Office Action dated Mar. 28, 2012, 26 pages.

U.S. Appl. No. 12/995.946, Non-Final Office Action dated Jan. 29, 2013, 25 pages.

U.S. Appl. No. 13/046,565, Final Office Action dated Feb. 2, 2012, 17 pages.

U.S. Appl. No. 13/046,565, Final Office Action dated Jul. 19, 2012, 41 pages.

U.S. Appl. No. 13/046,565, Non-Final Office Action dated Nov. 7, 2011, 17 pages.

U.S. Appl. No. 13/046,565, Non-Final Office Action dated Apr. 13, 2012, 40 pages.

U.S. Appl. No. 13/548,635, Non-Final Office Action dated Jun. 14, 2013, 6 pages.

U.S. Appl. No. 13/548,635, Notice of Allowance dated Sep. 16, 2013, 6 pages.

U.S. Appl. No. 13/548,770, Notice of Allowance dated Jun. 25, 2013, 6 pages.

U.S. Appl. No. 13/606,894, Non Final Office Action dated Feb. 5, 2013, 8 pages.

U.S. Appl. No. 13/606,894, Notice of Allowance dated May 24, 2013, 9 pages.

U.S. Appl. No. 14/010,326, Non-Final Office Action dated Mar. 24, 2015, 11 pages.

U.S. Appl. No. 14/010,326, Notice of Allowance dated Jul. 10, 2015, 8 pages.

U.S. Appl. No. 14/010,326, Restriction Requirement dated Jan. 30, 2015, 7 pages.

U.S. Appl. No. 14/878,387, First Action Interview Pilot Program Pre-Interview Communication dated Jul. 21, 2016, 4 pages.

U.S. Appl. No. 14/878,387, Notice of Allowance dated Nov. 10, 2016, 7 pages.

* cited by examiner

Front View of Facet

Side View of Facet

LASER DIODES WITH AN ETCHED FACET AND SURFACE TREATMENT

CROSS-REFERENCES TO RELATED APPLICATIONS

This application is a continuation of U.S. patent application Ser. No. 14/878,387, filed on Oct. 8, 2015, which is a continuation of U.S. patent application Ser. No. 14/010,326, filed on Aug. 26, 2013, which claims the benefit under 35 U.S.C. § 119(e) of U.S. Provisional Patent Application No. 61/695,276, filed on Aug. 30, 2012, each of which is incorporated herein by reference in its entirety for all purposes.

BACKGROUND OF THE INVENTION

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5%-10%, and further commercialization ensue into more high-end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

BRIEF SUMMARY OF THE INVENTION

The present invention relates generally to optical techniques. More specifically, the present invention provides a method and device using gallium and nitrogen containing substrates for optical applications. In a specific embodiment, the present invention provides a laser diode device. The device includes a gallium and nitrogen containing substrate, which has a surface region. The device has an n-type cladding region overlying the surface region and an active region comprising at least one active layer region overlying the n-type cladding region. The active region comprises a quantum well region or a double hetero-structure region. The device has a p-type cladding region overlying the active region and a laser stripe region formed overlying a portion of the surface region of the substrate. The device has a first end configured on one side of the laser stripe region and a second end configured on another side of the laser stripe. The device has a first etched facet provided on the first end of the laser stripe region, and a second facet formed on the second end of the laser stripe region. The device has a laser stripe length characterizing a stripe spatial distance between the first etched facet and the second facet. The device has a first edge region configured within a vicinity of the first facet and a second edge region configured within a vicinity of the second facet. The first edge region is characterized by a portion of a thickness of the substrate. The device has a primary emission surface formed from the first etched facet. The device has a first spatial off-set provided between the first edge region and first etched facet, and the first spatial off-set is configured in a direction normal to a surface of the first etched facet. The device has a first treatment provided overlying a portion of the first edge region. The first treatment is configured to interact with electromagnetic radiation provided within an internal region of the substrate.

In an alternative specific embodiment, the present invention provides a method for manufacturing a laser diode device. The method includes providing a gallium and nitrogen containing substrate comprising a surface region. The method includes forming an n-type cladding region overlying the surface region and forming an active region comprising at least one active layer region overlying the n-type cladding region. The active region comprises a quantum well region or a double hetero-structure region. The method includes forming a p-type cladding region overlying the active region and forming, using an etching process, a laser stripe region formed overlying a portion of the surface region of the substrate. The laser stripe region comprises a first end configured on one side of the laser stripe region and a second end configured on another side of the laser stripe, a first etched facet provided on the first end of the laser stripe region, and a second facet formed on the second end of the laser stripe region, a laser stripe length characterizing a stripe spatial distance between the first etched facet and the second facet. The method includes forming a first edge region configured within a vicinity of the first facet such that a first spatial off-set provided between the first edge region and first etched facet, and the first spatial off-set is configured in a direction normal to a surface of the first etched facet. The method includes forming a second edge region configured within a vicinity of the second facet and performing a first treatment process overlying a portion of the first edge region.

In certain aspects of the present disclosure, laser diode devices are provided comprising: gallium and nitrogen containing substrate, the substrate comprising a surface region; an n-type cladding region overlying the surface region; an active region comprising at least one active layer region overlying the n-type cladding region, the active region comprising a quantum well region or a double hetero-structure region; a p-type cladding region overlying the active region; a laser stripe region formed overlying a portion of the surface region of the substrate; a first end configured on one side of the laser stripe region and a second end configured on another side of the laser stripe region; a first etched facet provided on the first end of the laser stripe region, and a second facet formed on the second end of the laser stripe region; a laser stripe length characterizing a stripe spatial distance between the first etched facet and the second facet; a first edge region configured within a vicinity of the first etched facet and a second edge region configured within a vicinity of the second facet, the first edge region characterized by a portion of a thickness of the substrate; a primary emission surface formed from the first etched facet; a first spatial off-set provided between the first edge region and first etched facet, wherein the first spatial off-set is configured in a direction normal to the first etched facet; and a first treatment provided overlying a portion of the first edge region, the first treatment being configured to interact with electromagnetic radiation provided within an internal region of the substrate.

In certain aspects of the present disclosure, laser diode devices are provided comprising: a gallium and nitrogen containing substrate, the substrate comprising a surface region; the gallium and nitrogen containing surface region characterized by a nonpolar or semipolar orientation; an n-type cladding region overlying the surface region; an active region comprising at least one active layer region overlying the n-type cladding region, the active region comprising a quantum well region or a double hetero-structure region; a p-type cladding region overlying the active region; a laser stripe region formed overlying a portion of the surface region of the substrate; a first end configured on one side of the laser stripe region and a second end configured on another side of the laser stripe; a first etched facet provided on the first end of the laser stripe region, and a second facet formed on the second end of the laser stripe region; a laser stripe length characterizing a stripe spatial distance between the first etched facet and the second facet; a first edge region configured within a vicinity of the first facet and a second edge region configured within a vicinity of the second facet, the first edge region characterized by a portion of a thickness of the substrate; a primary emission surface formed from the first etched facet; a first spatial off-set provided between the first edge region and first etched facet, the first spatial off-set configured in a direction normal to a surface of the first etched facet; and a first treatment provided overlying a portion of the first edge region, the first treatment being configured to interact with electromagnetic radiation provided within an internal region of the substrate; wherein the laser diode device is operable at a wavelength range of about 425 nanometers to about 485 nanometers or at a wavelength range from about 500 nanometers to about 550 nanometers.

In certain aspects of the present disclosure, methods for manufacturing laser diode devices are disclosed, the methods comprising: providing a gallium and nitrogen containing substrate, the substrate comprising a surface region; forming an n-type cladding region overlying the surface region; forming an active region comprising at least one active layer region overlying the n-type cladding region, the active region comprising a quantum well region or a double hetero-structure region; forming a p-type cladding region overlying the active region; forming, using an etching process, a laser stripe region formed overlying a portion of the surface region of the substrate, the laser stripe region comprising a first end configured on one side of the laser stripe region and a second end configured on another side of the laser stripe, a first etched facet provided on the first end of the laser stripe region, and a second facet formed on the second end of the laser stripe region, a laser stripe length characterizing a stripe spatial distance between the first etched facet and the second facet; forming a first edge region configured within a vicinity of the first etched facet such that a first spatial off-set provided between the first edge region and first etched facet, and the first spatial off-set is configured in a direction normal to a surface of the first etched facet; forming a second edge region configured within a vicinity of the second facet; and performing a first treatment process overlying a portion of the first edge region.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

The present invention relates generally to optical techniques. More specifically, the present invention provides a method and device using gallium and nitrogen containing substrates for optical applications.

Figure 1:
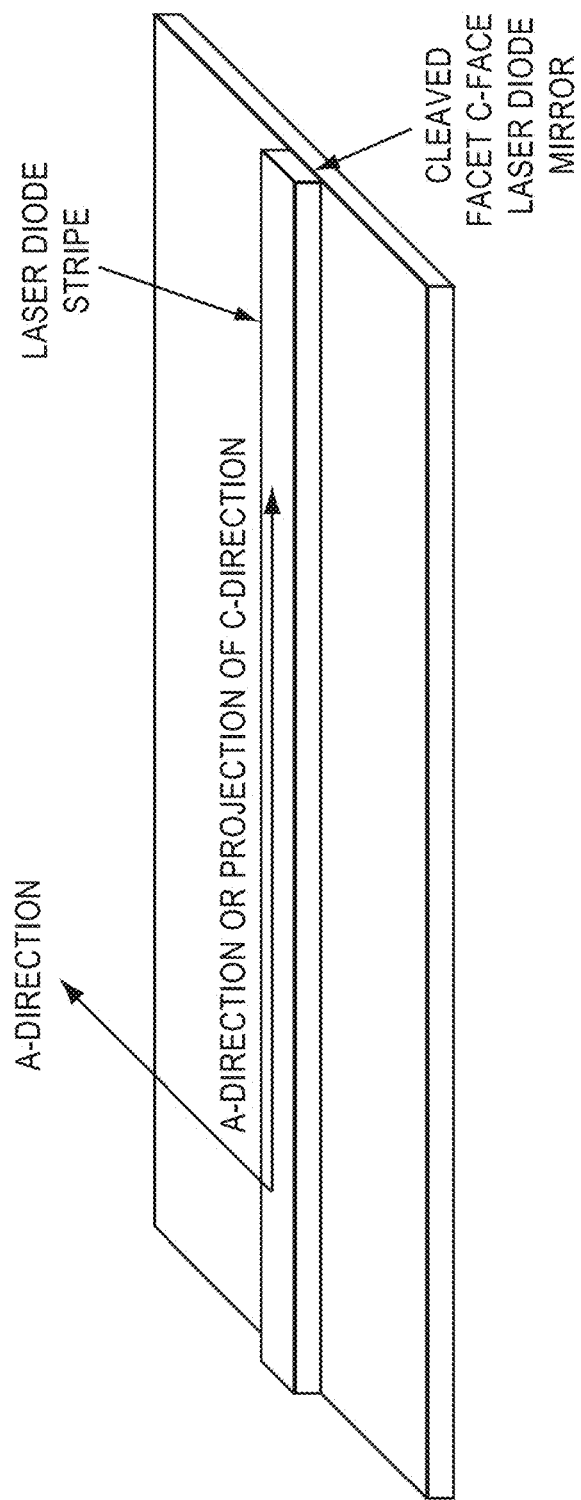
FIG. 1 shows a schematic diagram of a laser diode cavity formed on a nonpolar or semipolar gallium containing substrate.
Figure 3A:
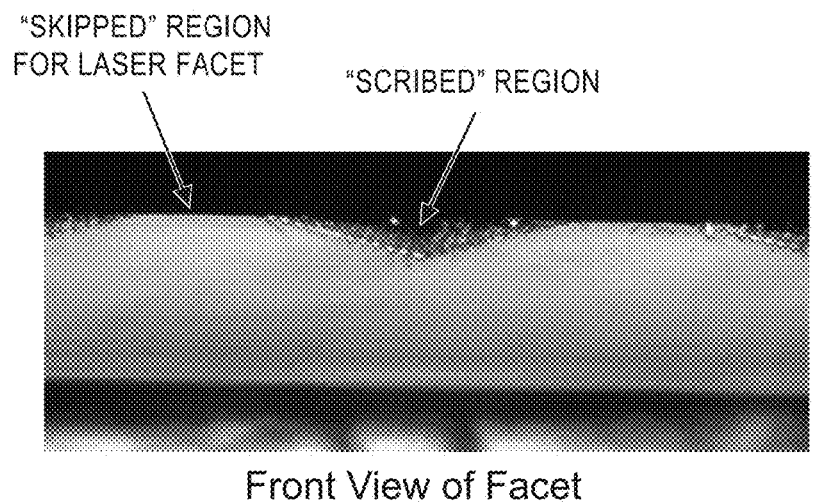
FIGS. 3A and 3B provide example images of cleaved facets for laser diodes fabricated on a semipolar (20-21) plane with c-projected laser stripes.
Figure 3B:
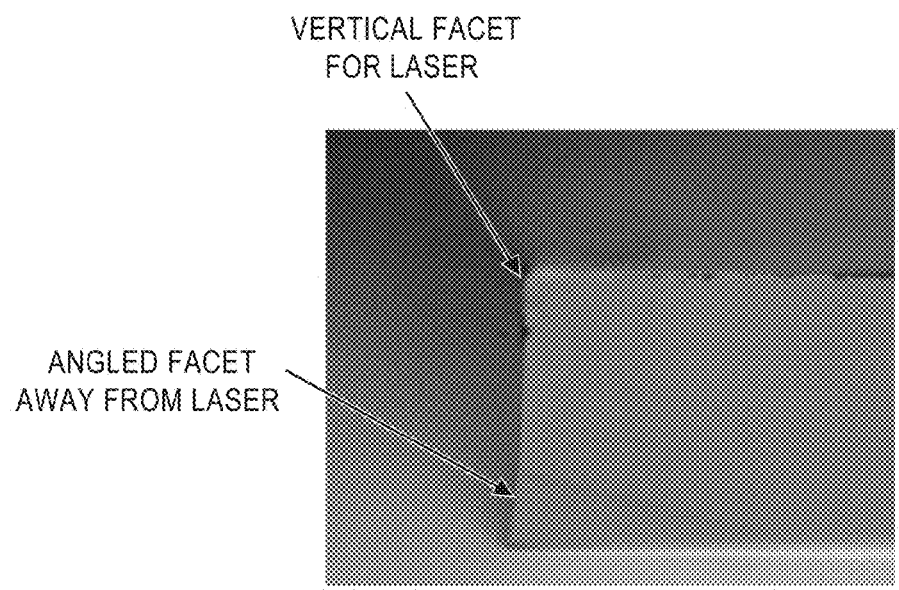

FIG. 1 shows a schematic diagram of a laser diode cavity formed on a nonpolar or semipolar gallium containing substrate. In this configuration the cavity is substantially aligned in the c-direction or the projection of the c-direction. In such in-plane ridge type laser diodes the optical output from the chip is emitted through a facet region near or at the edge of the chip. This facet will be defined by the edge of the chip for a cleaved facet configuration, but can be offset from the edge of the chip for an etched facet configuration. Since FIGS. 3A and 3B depict the facet at the edge of the chip, this figure more accurately represents a cleaved facet. FIG. 1 also shows a schematic diagram of a laser diode stripe formed on a nonpolar or semipolar crystal orientation. The laser is aligned in the c-direction or in the projection of the c-direction and has cleaved or etched facets at the ends of the cavity.

Figure 2:
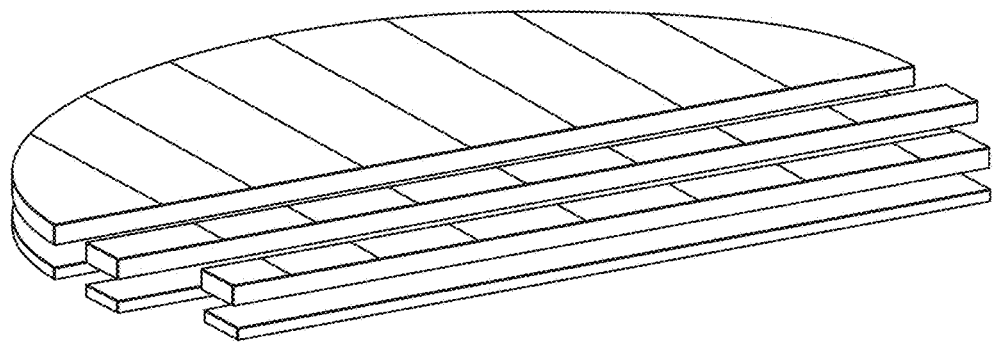
FIG. 2 is a schematic illustration of how a laser wafer that has been processed is subsequently separated into laser bars.
Figure 4:
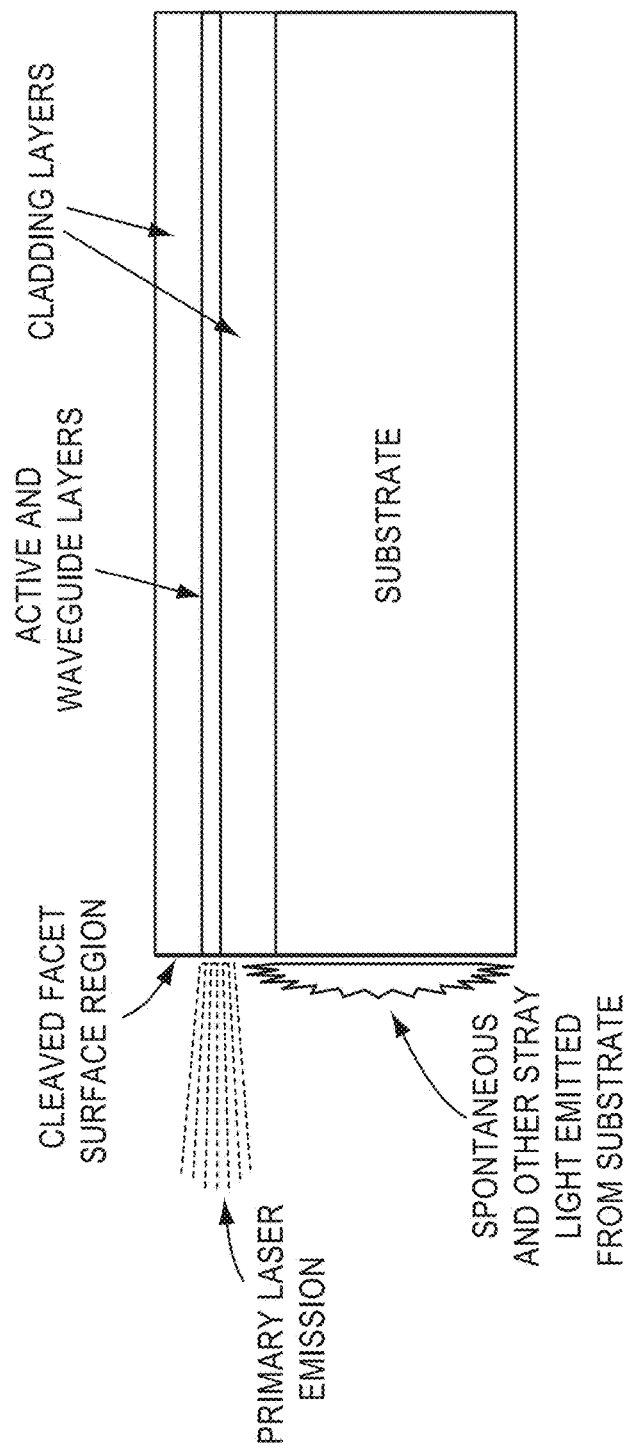
FIG. 4 is a simplified side-view schematic of a laser diode with cleaved facet mirrors illustrating the continuous nature of the surface that emits the primary emission and protrudes through the substrate.
Figure 5A:
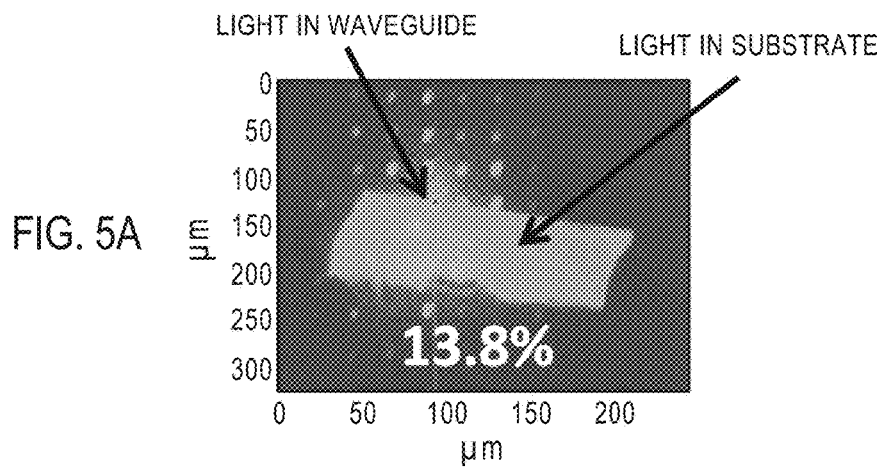
FIGS. 5A-5F show near field images from cleaved facet nonpolar/semipolar laser diodes with Al-free cladding layers where the images are obtained by focusing the laser diodes onto a CCD camera.
Figure 5B:
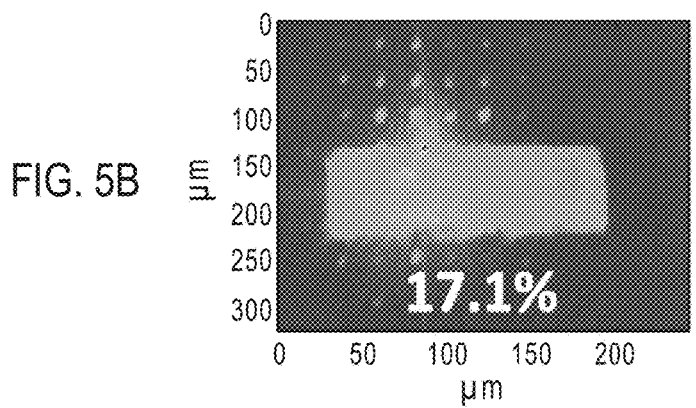
Figure 5C:
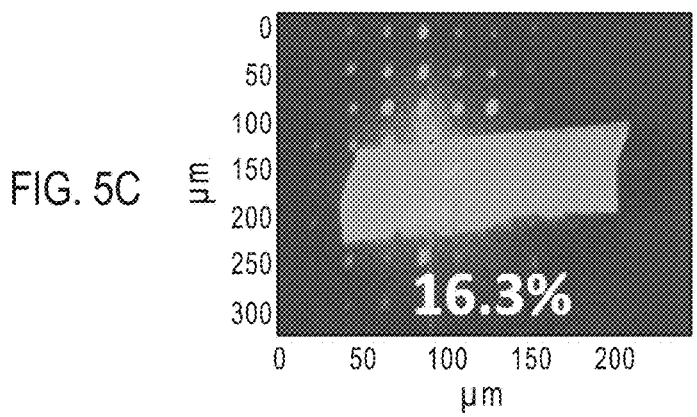
Figure 5D:
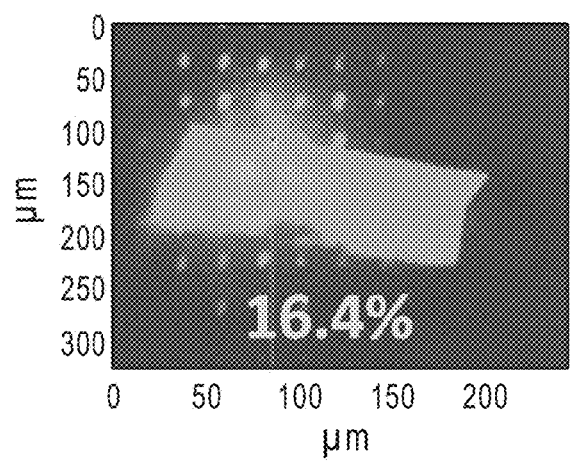
Figure 5E:
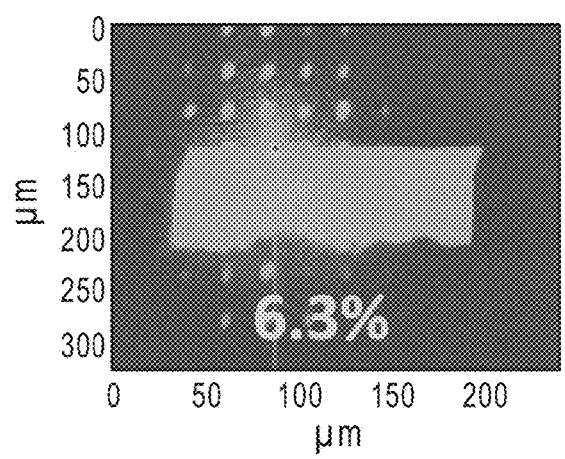
Figure 5F:
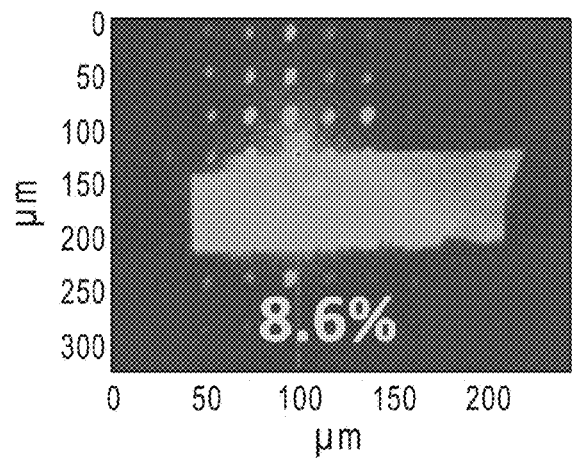
Figure 6A:
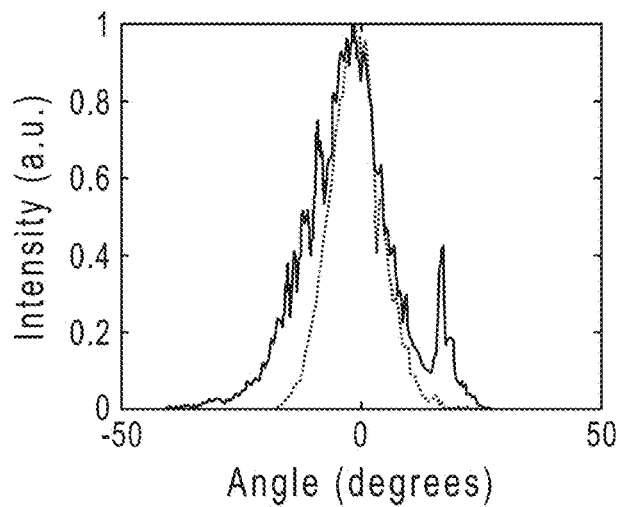
FIGS. 6A-6F present far field images from cleaved facet nonpolar/semipolar laser diodes with Al-free clad layers where the red traces represent the beam in the epitaxy direction and blue trace represents the beam perpendicular to the epitaxy direction.
Figure 6B:
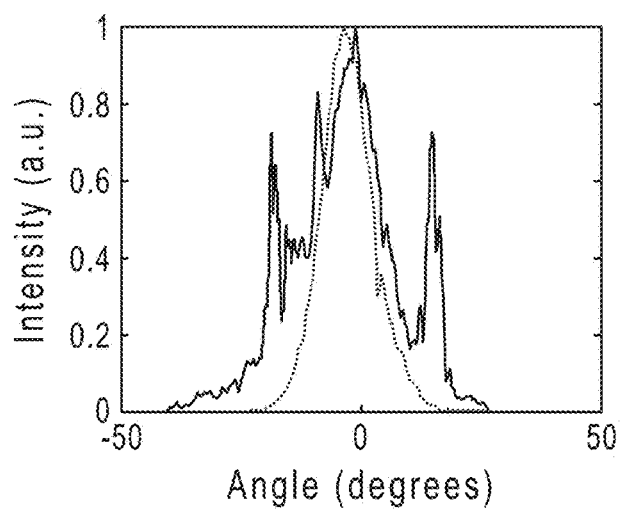
Figure 6C:
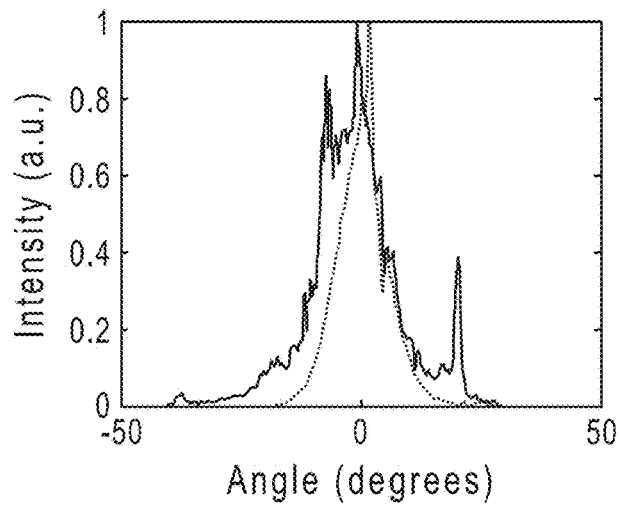
Figure 6D:
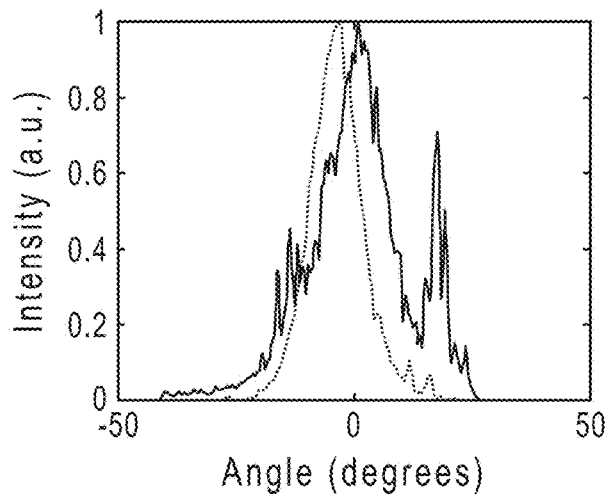
Figure 6E:
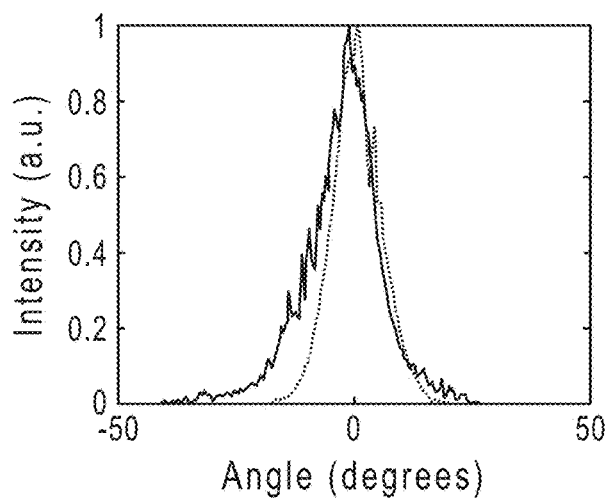
Figure 6F:
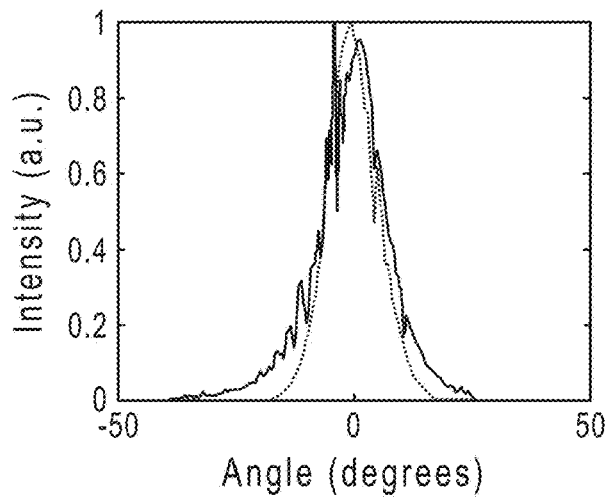

FIG. 2 is a schematic illustration of how a laser wafer that has been processed is subsequently separated into laser bars. In conventional processes the separation happens through a scribing and breaking process. The scribing can be induced with laser scribing, diamond scribing, or other scribing techniques. After scribing, the wafer is subjected to a carefully positioned and controlled force, which induces the cleavage. This process step is called the "breaking" step since the wafer material will be broken into 2 or more parts. In cleaved facet lasers the resulting cleaved surfaces form the mirror facets at the ends of the cavity to provide feedback into the cavity. FIG. 2 also shows a schematic illustration of how a processed wafer is separated into laser bars. In conventional processes the separation happens through a scribing and breaking process. For cleaved facet lasers the resulting cleaved surface forms the mirror facets at the ends of the cavity. FIGS. 3A and 3B provide example images of actual cleaved facets for laser diodes fabricated on (20-21) with c-projected laser stripes. As seen in the images, the cleaved face forms a continuous surface from the top of the wafer to the bottom of the wafer such that the same surface that emission originates from is the same surface that protrudes through the substrate. FIGS. 3A and 3B show example images of cleaved facets for laser diodes fabricated on (20-21) with c-projected laser stripes. As seen in the images, the cleaved face forms a continuous surface from the top of the wafer to the bottom of the wafer. FIG. 4 is a simplified side-view schematic of a laser diode with cleaved facet mirrors illustrating the continuous nature of the surface that emits the primary emission and protrudes through the substrate. In laser devices that contain cladding layers that are not sufficient to keep a substantial amount of spontaneous and other stray light from entering the substrate the continuous nature of this cleaved surface can lead to difficulties in mitigating the stray substrate light and achieving a clean emission pattern. This anomalies and imperfections in the emission patterns result from stray light interfering with itself and the primary emission to create large amounts of light outside the primary waveguide and ripple patterns in the intensity. FIG. 4 also shows a simplified side-view schematic of a laser diode with cleaved facet mirrors and cladding layers that are not sufficient to keep a substantial amount of stray light from residing in the substrate. As seen in the figure, the primary laser emission is contained in a beam concentrated in the laser waveguide and active layers emerging from the laser facet. However, due to the substantial amount of light in the substrate there is an undesirable amount of light emitting from below the active region in the substrate. The continuous surface that forms both the surface that the primary emission is incident from and the edge of chip, mitigating this light is very difficult. This substrate light leads to noisy emission patterns due to optical interference and stray light.

To illustrate the non-ideal beam qualities resulting from insufficient cladding layers in cleaved facet lasers, FIGS. 5A-5F presents near field images from cleaved facet nonpolar/semipolar laser diode with Al-free cladding layers taken by focusing the laser onto a CCD camera. As can be seen, in these laser devices there is a substantial amount of light in the substrate compared to in the primary waveguide. More precisely, about 15.7% of the light is emitted from the substrate on average for these devices. This substrate light leads to non-optimal light output characteristics and noisy far field patterns and is therefore undesirable. The intensity plots are on log scale. The measured power in the substrate as a fraction of the total output power is shown in white. The periodic bright spots are an artifact of saturation of the CCD. FIGS. 5A-5F also show near field images from cleaved facet nonpolar/semipolar laser diode with Al-free cladding layers taken by focusing the laser onto a CCD camera. As can be seen, in these laser devices there is a substantial amount of light in the substrate compared to in the primary waveguide. More precisely, about 15.7% of the light is emitted from the substrate on average for these devices. This substrate light leads to non optimal light output characteristics and noisy farfield patterns and is therefore undesirable. The intensity plots are on log scale. The measured power in the substrate as a fraction of the total output power is shown in white. The periodic bright spots are an artifact of saturation of the CCD. FIGS. 6A-6F present far field images from cleaved facet nonpolar/semipolar laser diodes with Al-free clad layers where the solid lines represent the beam in the epitaxy direction and dotted lines represents the beam perpendicular to the epitaxy direction. The strong interference fringes result from the substrate light and leads to noisy far field patterns with peaks to the left and right of the beam along with interference fringes. Such anomalies in the optical emission are non-ideal as they make it more challenging to efficiently couple all the light through external optics or generally to collect all of the light emitted from the laser device. FIGS. 6A-6F also present far field images from cleaved facet nonpolar/semipolar laser diodes with Al-free clad layers where the solid lines represent the beam in the epi direction and the dotted lines represent the beam perpendicular to the epi direction. Interference results from the substrate light and leads to the noisy far field patterns with peaks to the left and right of the beam along with interference fringes.

The above discussion addresses the detrimental effects of spontaneous or other stray light that leaks to the substrate and causes anomalies and non-idealities in the laser diode emission characteristic. The stray light or substrate light becomes more of an issue in laser diodes where the cladding region does not provide enough index contrast to sufficiently confine all the emitted light to the waveguide region. Such insufficient cladding regions could exist in conventional c-plane laser diodes with Al-containing laser diodes, in nonpolar or semipolar laser with Al-containing cladding regions, or in nonpolar or semipolar laser diodes with substantially Al-free cladding regions. Here we propose an alternative and very practical method using etched facet laser diodes. The invention disclosed here provides a means to improve the optical beam quality within laser diodes by employing etched facets for mirrors and a surface treatment step.

Etched facets provide an alternative means to cleaved facets for mirror formation in laser diodes. Etched facets are typically lithographically defined using contact or stepper lithography and a hard mask such as silicon dioxide, silicon nitride or other, or a photoresist soft mask for the etching step. The etching step can be performed using various techniques such as inductively coupled plasma (ICP) etching, reactive ion etching (ME), chemical assisted ion beam etching (CAIBE), wet etching, or other. Etched facets can provide for many potential benefits over cleaved facets such as increased yield, improved performance, or increased design flexibility in a laser diode through such means as integrating total internal reflector mirrors.

Figure 7:
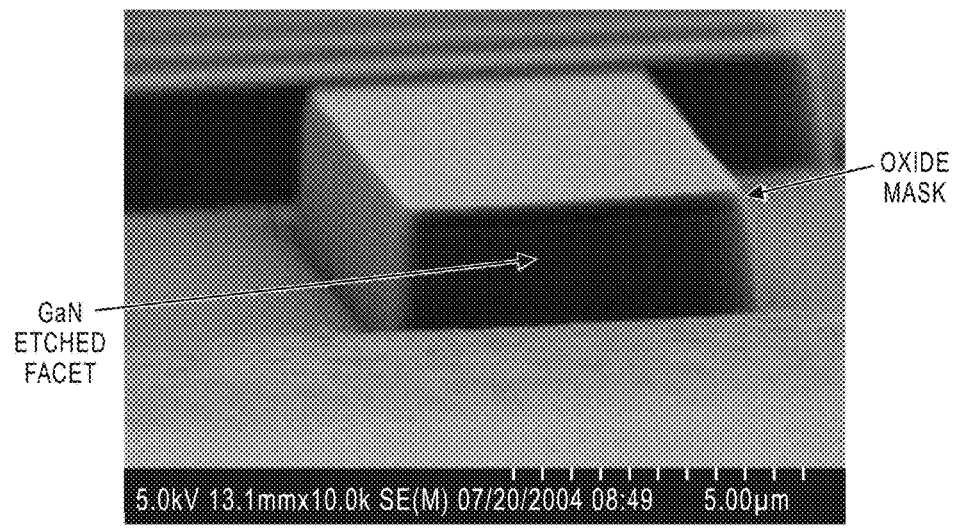
FIG. 7 shows an example image of etched facet technology disclosed in the literature.

FIG. 7 presents an example image of etched facet technology taken from the literature. Such etched facets can be used to form laser mirrors on GaN-based laser diodes including nonpolar and semipolar oriented lasers. As seen in the figure, a key difference between a cleaved facet and an etched facet is that the etched facet does not form a continuous surface including both the primary laser emission region and the edge of the chip region. Rather, in conventional etched facet lasers the primary laser emission region at the active and waveguide layers is offset from the surface protruding through the substrate and forming the edge of the chip. Since these surfaces are separated and formed at different times, this surface discontinuity can be exploited to mitigate substrate light and improved the beam quality in nonpolar or semipolar laser diode. FIG. 7 also shows an example image taken from the literature of etched facet technology that can be used to form laser mirrors on nonpolar and semipolar GaN. As seen in the figure, the etched facet does not form a continuous surface with the edge of the chip. This discontinuity can be exploited to mitigate substrate light and improved the beam quality in nonpolar or semipolar laser diode.

Figure 8:
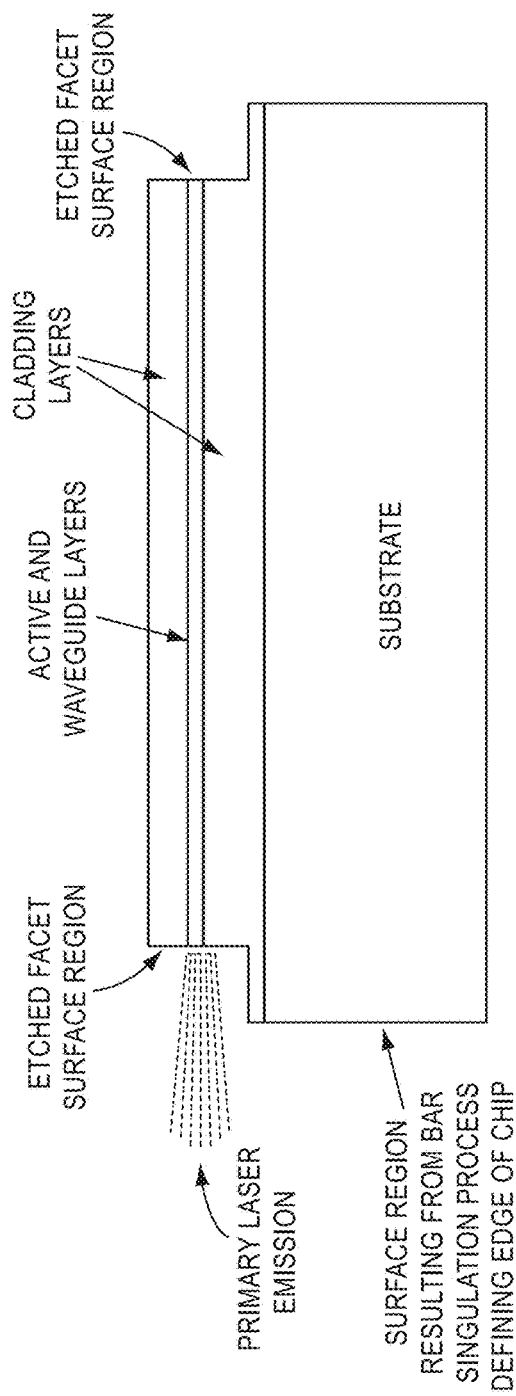
FIG. 8 shows a simplified side-view schematic of a laser diode using etched facet mirrors.

FIG. 8 shows a simplified side-view schematic of a laser diode using etched facet mirrors. As shown in FIG. 8, the etched facet surface that the primary emission is emitted from is a different surface than the surface defining the edge of the chip resulting from the bar singulation process and protruding through the substrate. Since these edge regions are discontinuous and are formed at different times in the laser process, surface modification steps can be included to manage or alter the stray light in the substrate and hence improve the optical beam quality of the laser diode. Aggressive surface techniques can be applied to the second surface defining the edge of the laser chip without compromising the quality of the etched facet surface, which is critical for the laser performance. This surface treatment can reflect, scatter, and/or absorb the stray light in the substrate so as to suppress the magnitude of emission of the stray light and hence improved the laser output quality. Etched facet laser diodes that do not possess sufficient claddings to keep stray light out of the substrate will have substantially more desirable emission pattern with this treatment layer. FIG. 8 also shows a simplified side-view schematic of a laser diode with etched facet mirrors. As seen in the figure, the etched facet mirror surface region where the primary emission emerges from is a different surface region from the surface region resulting from the bar singulation process protruding through the substrate that defines the edge of the chip. Since these surface regions are discontinuous treatments can be easily applied to the substrate surface.

Figure 9:
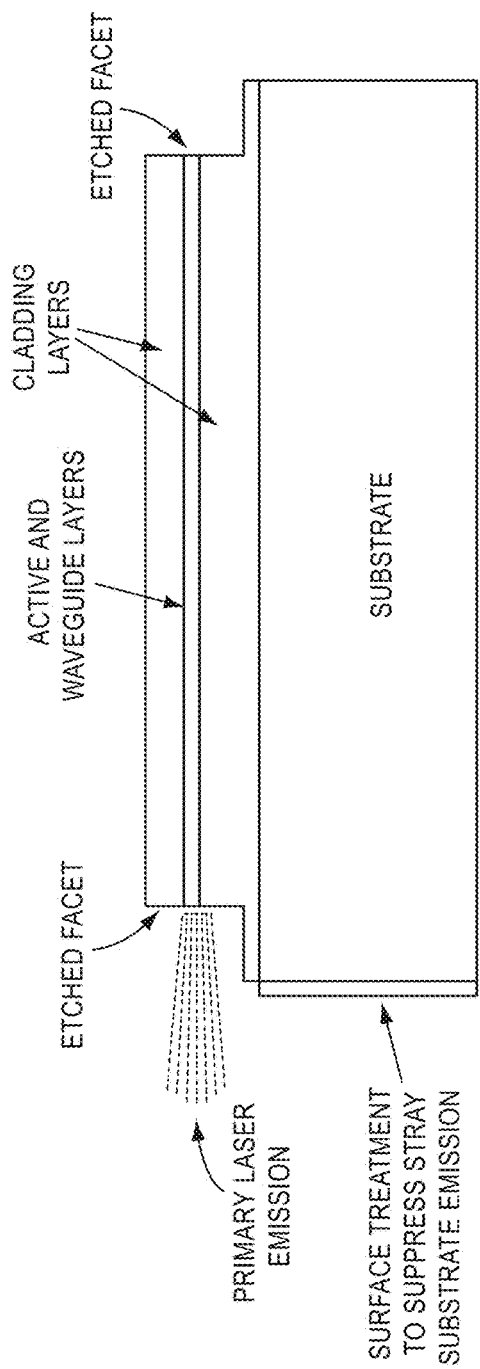
FIG. 9 shows a simplified side-view schematic of a laser diode with etched facet mirrors where a treatment is applied to the surface defining the edge of the chip below the point of emission.

In this invention we apply a surface treatment step to at least one surface comprising the edge of the laser diode chip, which is not the same surface that the laser emission is incident from. FIG. 9 shows a simplified side-view schematic of a laser diode with etched facet mirrors where a treatment is applied to the surface defining the edge of the chip below the point of emission. This treatment can reflect, scatter, and/or absorb the stray light in the substrate so as to suppress the magnitude of emission of the stray light and hence improved the laser output quality. Etched facet laser diodes that do not possess sufficient claddings to keep stray light out of the substrate will have more desirable emission pattern with this treatment. FIG. 9 also shows a simplified side-view schematic of a laser diode with etched facet mirrors. A treatment is applied to the surface defining the edge of the chip below the point of emission. This treatment can reflect, scatter, and/or absorb the stray light in the substrate so as to suppress the magnitude of emission of the stray light and hence improved the laser output quality. Etched facet laser diodes that do not possess sufficient claddings to keep stray light out of the substrate will have more desirable emission pattern with this treatment.

Figure 10:
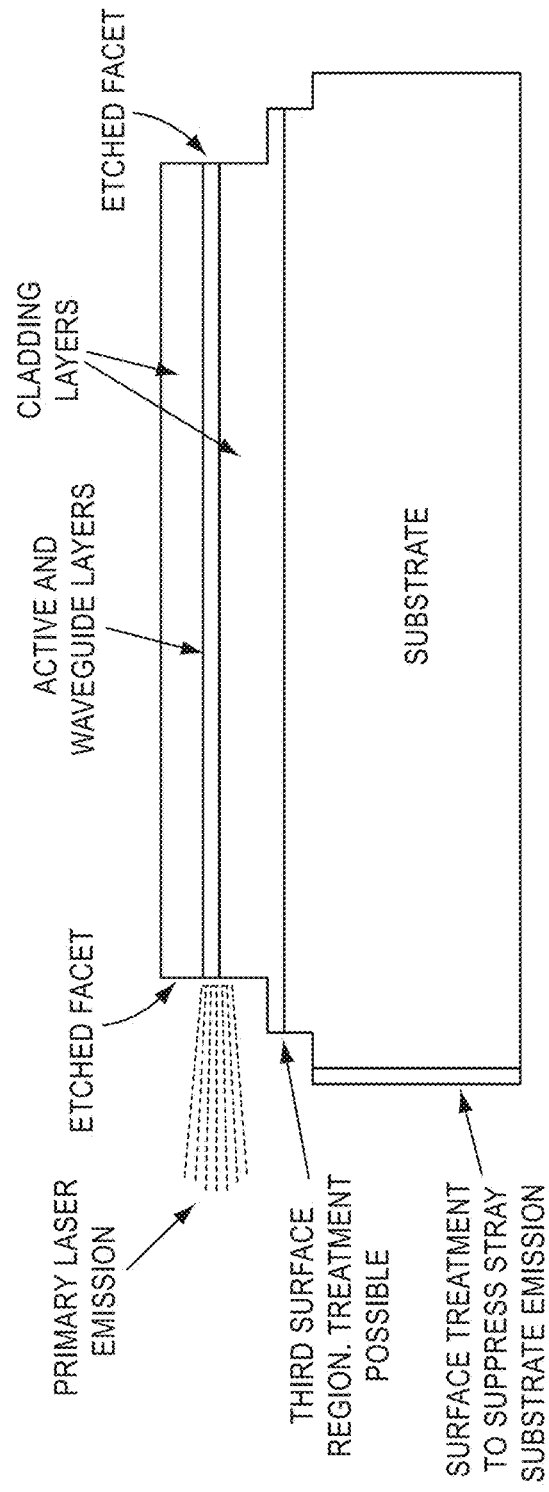
FIG. 10 shows a simplified side-view schematic of an alternative embodiment of a laser diode with etched facet mirrors and a treatment layer applied to the surface defining the edge of the chip below the point of emission.

FIG. 10 shows a simplified side-view schematic of an alternative embodiment of a laser diode with etched facet mirrors and a treatment layer applied to the surface defining the edge of the chip below the point of emission. In this embodiment a third edge region is formed in the fabrication process such that there are now two surfaces below the etched facet edge region. This third edge region may or may not be subjected to a treatment step. This embodiments illustrates that there may be other surface configurations where more than one edge region beyond the etched facet edge region will be present. This invention includes all surface configurations with a treatment step. FIG. 10 shows simplified side-view schematic of a laser diode with etched facet mirrors and a treatment layer applied to the surface defining the edge of the chip below the point of emission. This figure depicts an alternative embodiment to that in FIG. 11 since there is a third surface region such that there are now two surfaces below the etched facet surface region. This third surface region may or may not be subjected to a treatment step.

Figure 11:
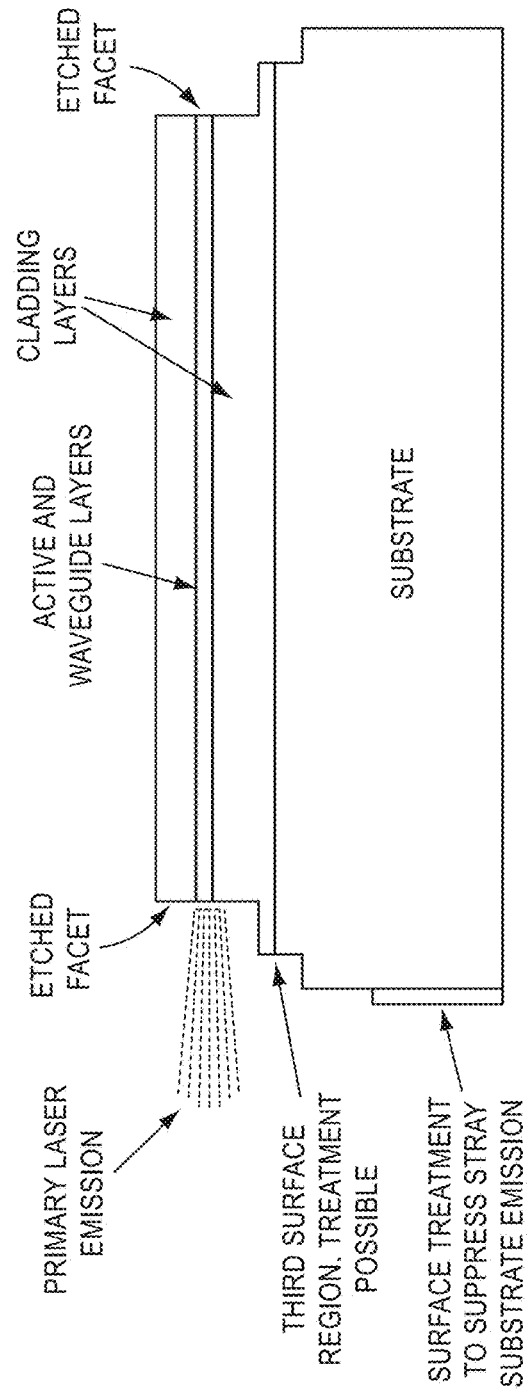
FIG. 11 shows a simplified side-view schematic of yet another alternative embodiment of a laser diode with etched facet mirrors and a treatment layer applied to the surface defining the edge of the chip below the point of emission.

FIG. 11 shows a simplified side-view schematic of another alternative embodiment of a laser diode with etched facet mirrors and a treatment layer applied to the surface defining the edge of the chip below the point of emission. In this embodiment the surface treatment region does not cover the entire edge region defining the edge of the chip. Instead the treatment only partially covers the surface. It is not necessary to cover the entire edge region to achieve benefits from the surface treatment region. This embodiment illustrates that there may be other surface treatment configurations where the amount of surface treatment coverage or geometry region will be modified or altered. This invention includes all such surface configurations with a treatment step. FIG. 11 also shows a simplified side-view schematic of a laser diode with etched facet mirrors and a treatment layer applied to the surface defining the edge of the chop below the point of emission. This figure depicts an alternative embodiment to that in FIG. 12 since the surface treatment region does not cover the entire surface region. It is not necessary to cover the entire surface region to achieve benefits from the surface treatment region.

There are many methods that could be employed to achieve the surface treatment. In a preferred method, the surface treatment process would expose the surface to a laser treatment, where the laser beam modifies the surface in various ways. The laser treatment step would modify the surface by inducing roughness and generating redeposition of laser slag material on the surface. Such roughness would lead to light scattering and such a gallium rich slag material would be absorbing to the light. Therefore, a laser technique could be used modify the surface to absorb and/or scatter the substrate light, hence reducing the emission intensity of the light in the same direction of the beam and therefore improve the light emission characteristic.

Various types of laser apparatus exist and various techniques could be applied to optimize and modify this laser treatment step. For example, laser scribing devices apparatus operating in a wavelength of about 270 nm to 370 nm may be used. In a preferred embodiment, the method uses a UV (355 nm) laser to form the treatment step. In a specific embodiment, the laser is configured on a system, which allows for the control of the power and speed of the laser treatment enabling accurate depth and optimized surface characteristics from the laser surface treatment technique. For example, the laser surface treatment technique could be used to cut through the substrate material and separate the processed laser wafer into laser bars. In this embodiment the laser technique used to improve the beam quality would also function to separate the laser bars from the wafer. That is, after the laser top and bottom side processing is complete and the etched facet mirrors are formed, the lasers are separated into bars using a laser scribing technique. The laser scribing would be applied to the top or preferably the bottom of the substrate and would partially or fully penetrate through the substrate. The laser may possibly penetrate through other epitaxial layers in the vicinity of the substrate. The laser scribing would induce roughness and/or re-deposition on at least one surface defining the edge of the chip and therefore modify the light emission characteristic from the substrate in a favorable way by absorbing the light or by scattering the light.

Figure 12A:
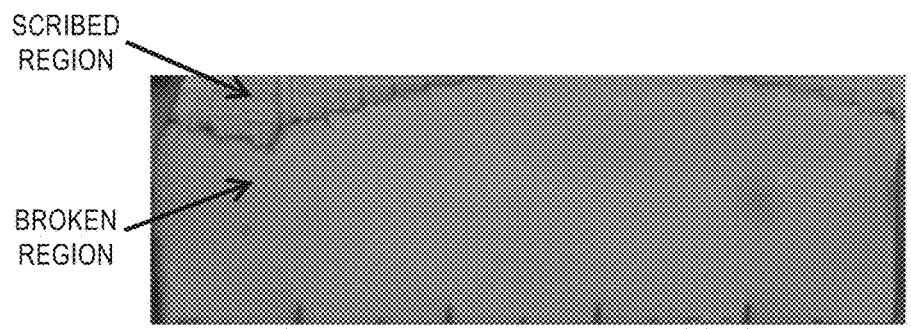
FIG. 12A, FIG. 12B, FIG. 13A, and FIG. 13B present empirical data demonstrating the benefits of a laser surface treatment applied during the bar singulation step in etched facet lasers compared to that of a conventional cleaved facet laser.
Figure 12B:
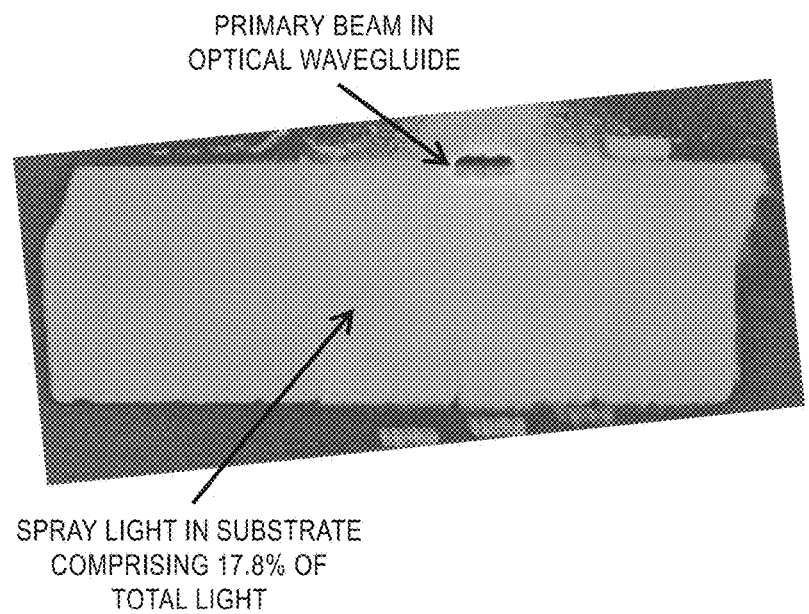
Figure 13A:
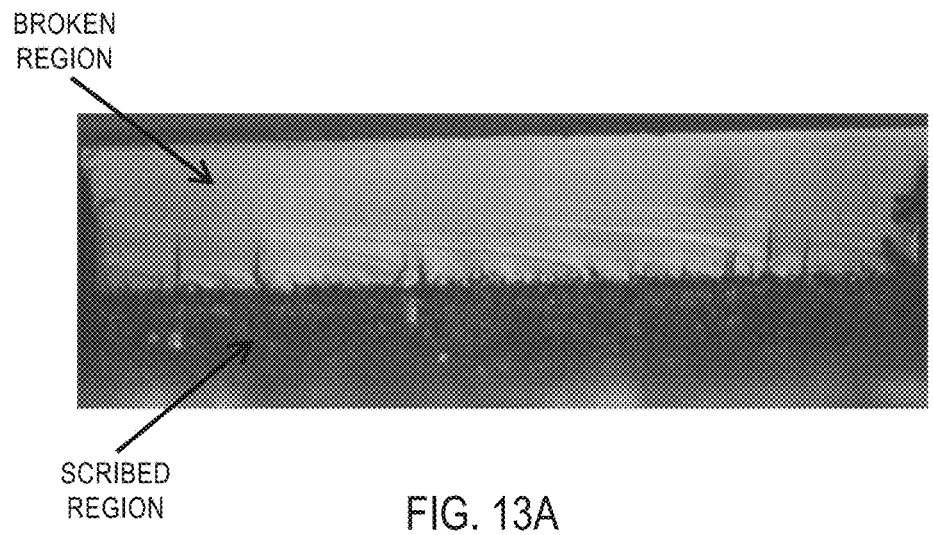
Figure 13B:
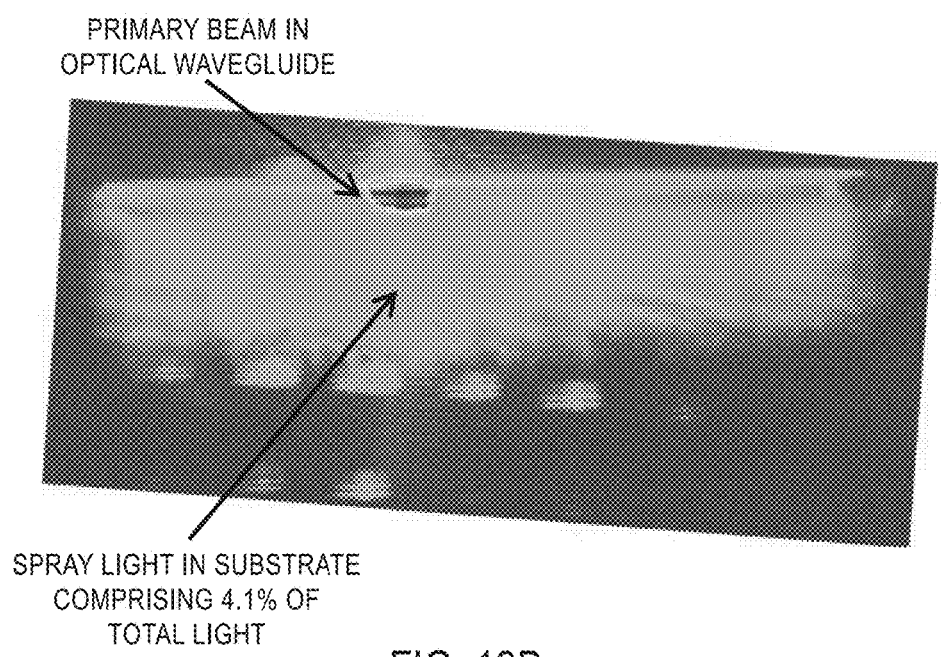

FIGS. 12A, 12B, 13A, and 13B present empirical data demonstrating the benefits of a laser surface treatment applied during the bar singulation step in etched facet lasers compared to that of a conventional cleaved facet laser. FIG. 12A shows the end on view of a conventional cleaved facet laser with arrows pointing to locations on the front surface depicting the laser scribed regions and the broken regions. FIG. 12B shows near-field imaging of the cleaved facet laser diode operating above threshold. As can be seen in FIG. 12B the stray light in the substrate comprises 17.8% of the total emitted light. This substantial amount of stray substrate light will result in interference fringes in the beam along with other imperfections. FIG. 12A shows the end on view of a conventional cleaved facet laser with arrows pointing to locations on the front surface depicting the laser scribed regions and the broken regions. This laser uses a top side skip and scribe technique to form an optimal facet region to result in desirable laser performance. FIG. 12B shows near-field imaging of the optical output from the cleaved facet laser diode operating above threshold. As can be seen in FIG. 12B the stray light in the substrate comprises 17.8% of the total emitted light. This substantial amount of stray substrate light will result in interference fringes in the laser output beam along with other imperfections. FIGS. 12A and 12B also show end on views of conventional cleaved facet lasers where FIG. 12A shows an optical micrograph illustrating scribe region ad broken region and FIG. 12B shows near-filed intensity profile of operating laser diode with 17.8% of the total emitted light contained in the substrate. To demonstrate the benefits of this invention FIG. 13A shows the end on view of an etched facet laser with a laser treated substrate surface from the bar singulation process with arrows depicting the laser scribed regions and the broken regions. In this embodiment of the invention a continuous laser scribe treatment is applied from the bottom of the substrate and penetrates about 30-35 µm through the ~70 µm substrate such that nearly half the edge region was subjected to the laser treatment. The drastic benefits of this laser treatment can be seen in FIG. 13B which presents near-field imaging of the optical output from the etched facet laser diode operating above threshold. As can be seen from this figure the stray light in the substrate comprises only 4.1% of the total emitted light. This represents a greater than 75% reduction in stray light over the conventionally cleaved facet laser diode and will provide a cleaner laser output beam with less stray light. Of course, this demonstration is merely an example of the benefits of laser treatment step to improve the beam quality. This demonstration is highly unoptimized. For example, the laser treatment could have covered 75% or up to 100% of the front surface and hence reduced the stray substrate light to less than 1% of the total light. FIGS. 13A and 13B also show an end on view of etched fact laser with bottom side laser treatment where FIG. 13A shows optical micrograph illustrating scribe region and broken region and FIG. 13B shows near-field intensity profile of operating laser diode with only 4.1% of the total emitted light contained in the substrate, which is greater than a 75% reduction over the cleaved facet.

An alternative to this embodiment where the bar singulation or separation step is used to induce surface modification for improved beam quality would include diamond scribing. By using a diamond or other hard material to form a scribe on this surface, the surface would become rough and therefore modify the light emission from the substrate. It is to be appreciated that surface treatment can also be formed by using cutting tools (cutting wheel), dry etching, wet etching, diamond scribing, etc.

In an alternative embodiment the surface treatment is comprised of a metal coating functioning to absorb and reflect the light in the substrate. Such a metal coating could be applied to the edge region by several deposition techniques including electron beam deposition, sputtering deposition, thermal evaporation, or others. Examples of metals would be gold, titanium, platinum, nickel, palladium, aluminum, or others.

In yet an alternative embodiments the surface treatment is comprised of a dielectric coating functioning to reflect the light in the substrate and prevent it from emitting out of the substrate on the same side of the chip as the primary emission. Such a dielectric coating could be applied to the edge region by several deposition techniques including plasma enhanced chemical vapor deposition, electron beam deposition, sputtering deposition, thermal evaporation, or others. Examples of dielectrics would be silicon oxide, silicon nitride, aluminum oxide, titania, hafnia, tantalum pentoxide, zirconia, or others.

In an alternative embodiment a laser scribing or etching technique on the backside of the wafer to create a trench region in the substrate. The trench region is then coated with one or more metal layers and/or one or more dielectric layers. After coating the trench region the wafer would then be broken into laser bars such that the ends of the laser bars would be defined by the sidewalls of the trench region with the metal and/or dielectric coating regions. As a result the stray substrate light would be reflected or absorbed by the coating regions.

Figure 14:
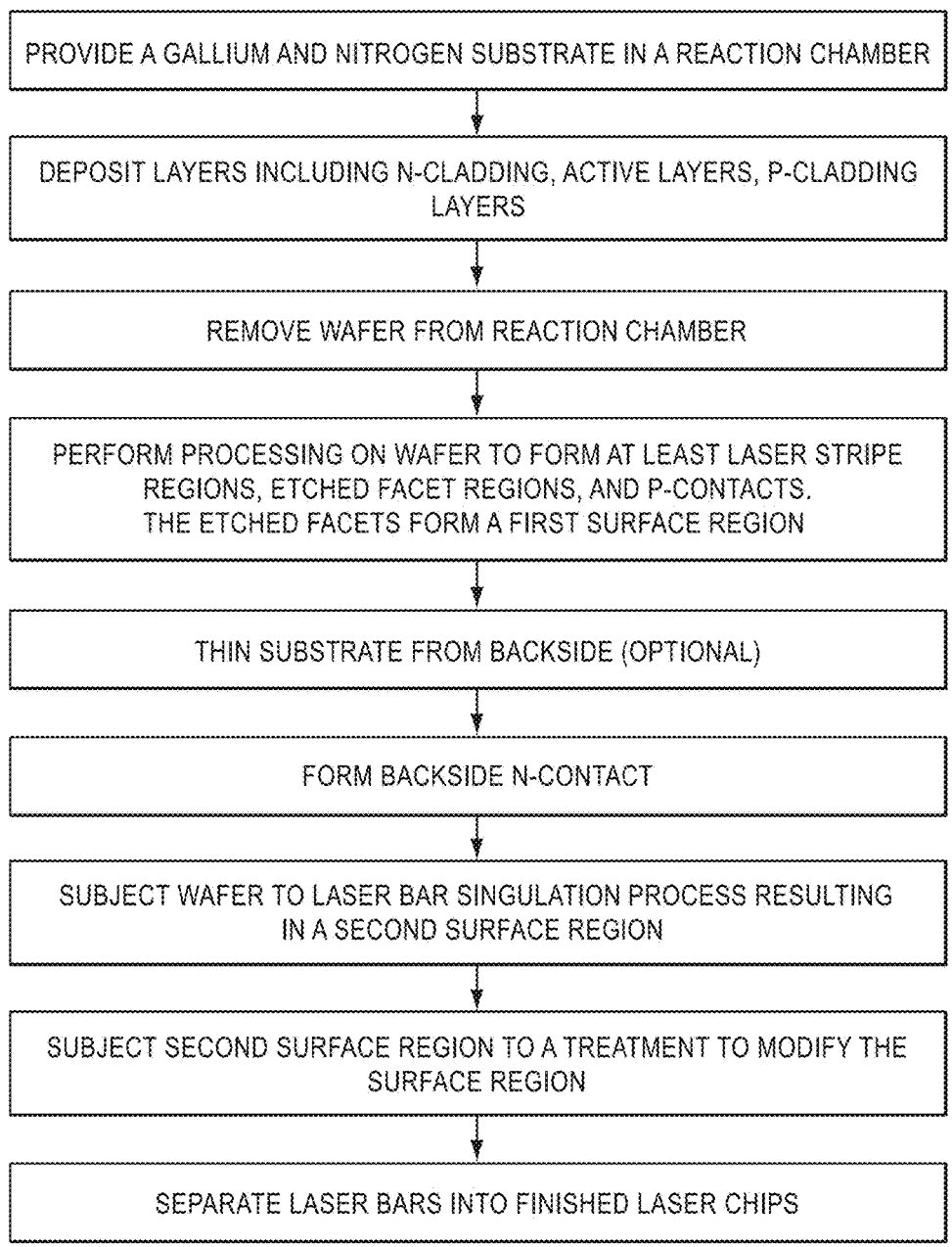
FIG. 14 outlines an example process flow for certain embodiments of the present disclosure for treating a substrate surface of etched facet laser diodes to improve the beam quality.
Figure 15:
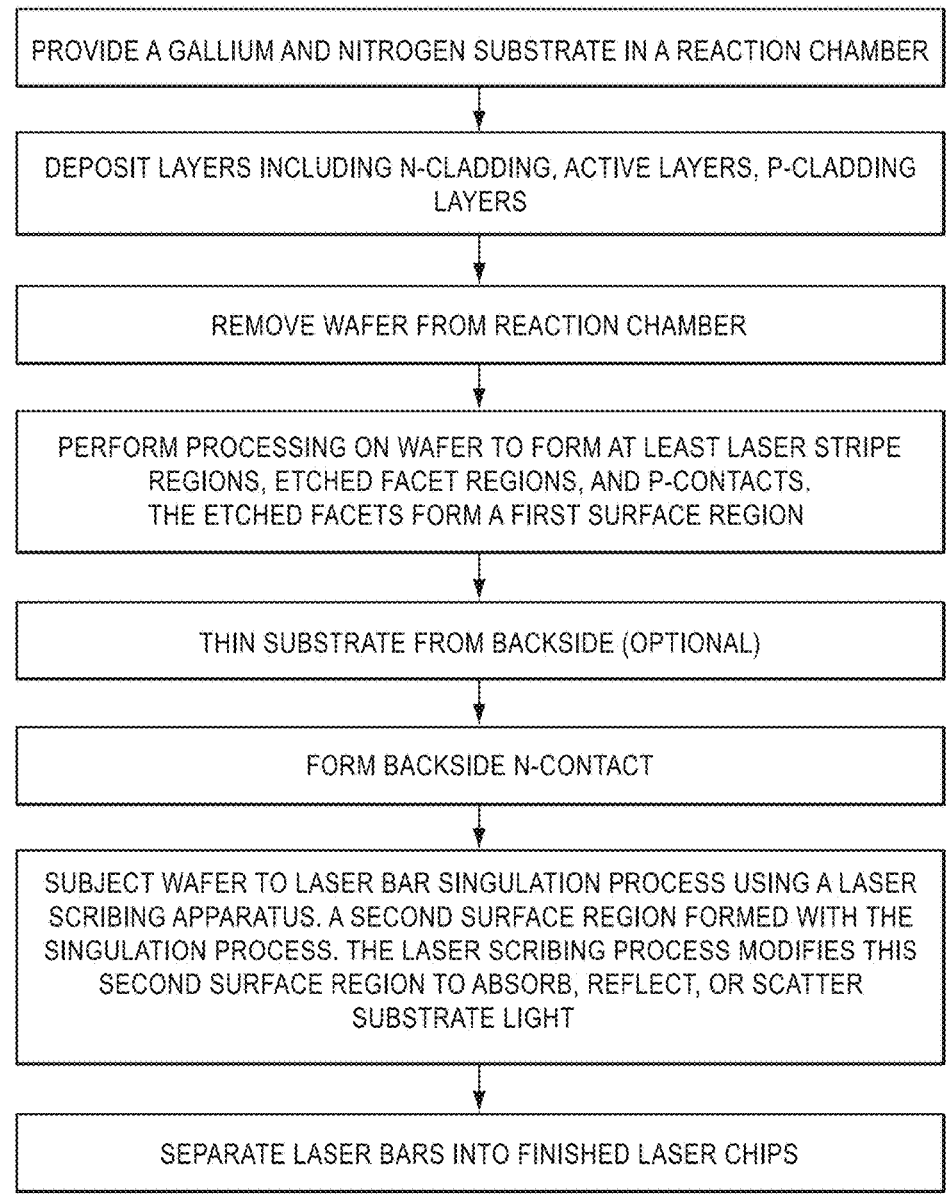
FIG. 15 outlines an example process flow for an alternative embodiment that more specifically employs a laser scribing technique to both treat the edge region of the substrate and singulate the laser bars.

FIG. 14 outlines an example process flow for one embodiment of this invention for treating the substrate surface in etched facet laser diodes to improve the beam quality. FIG. 15 outlines an example process flow for an alternative embodiment that more specifically employs a laser scribing technique to both treat the edge region of the substrate and singulate the laser bars.

It is to be appreciated that the process of forming trench structures can be convenient integrated into manufacturing process of laser devices. A method of processing a laser device according to one or more embodiments may be outline as follows:
1. Start;
2. Provide a gallium and nitrogen substrate in a reaction chamber;
3. Deposit layers including n-cladding, active layers, p-cladding layers;
4. Remove wafer from reaction chamber;
5. Perform processing on wafer to form at least laser stripe regions, etched facet regions, and p-contacts. The etched facets form a first edge region;
6. Thin substrate from backside (optional);
7. Form backside n-contact;
8. Subject wafer to bar singulation process resulting in a plurality of laser bars and forming a second edge region that is a different edge region from the first etched facet edge region;
9. Subject second edge region to a treatment to modify the second edge region to absorb, reflect, or scatter substrate light;
10. Perform other steps as desired;
11. Singulate bar structures into individual dies having laser device; and
12. Perform other steps as desired.

Another method of processing a laser device according to one or more embodiments may be outline as follows:
1. Start;
2. Provide a gallium and nitrogen substrate in a reaction chamber;
3. Deposit layers including n-cladding, active layers, p-cladding layers;
4. Remove wafer from reaction chamber;
5. Perform processing on wafer to form at least laser stripe regions, etched facet regions, and p-contacts. The etched facets form a first edge region;
6. Thin substrate from backside (optional);
7. Form backside n-contact;
8. Subject wafer to bar singulation process resulting in a plurality of laser bars using a laser scribing process. A second edge region formed with the singulation process that is a different edge region from the first etched facet edge region. The laser scribing process modifies this second edge region to absorb, reflect, or scatter substrate light;
9. Perform other steps as desired;
10. Singulate bar structures into individual dies having laser device; and
11. Perform other steps as desired.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

In an example, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Provisional Application No. 61/347,800, commonly assigned, and incorporated by reference for all purposes.

In other embodiments, the present laser device can be configured in a variety of applications. Such applications include laser displays, metrology, communications, health care and surgery, information technology, and others. As an example, the present laser device can be provided in a laser display such as those described in U.S. application Ser. No. 12/789,303 filed on May 27, 2010, which claims priority to U.S. Provisional Application Nos. 61/182,105 filed on May 29, 2009, and 61/182,106 filed on May 29, 2009, each of which is incorporated by reference herein.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Although the embodiments above have been described in terms of a laser diode, the methods and device structures can also be applied to any light emitting diode device. Therefore, the above description and illustrations should not be taken as limiting the scope of the present invention which is defined by the appended claims.

What is claimed is:

1. A laser diode device comprising:
    a surface region bounded by edge regions including a first edge region; and
    a laser stripe overlying a portion of the surface region, the laser stripe characterized by a length in a length direction and a width in a width direction, in the length direction the laser stripe includes a first end and a second end opposite the first end, the length direction being substantially orthogonal to the first edge region, and the width direction being substantially parallel to the first edge region;
    wherein the laser stripe forms a ridge that protrudes outward from the surface region and is spaced on all sides from the edge regions by portions of the surface region;
    wherein the first end of the laser stripe comprises a first facet, and the second end of the laser stripe comprises a second facet, the first facet having a primary emission surface, the first facet being substantially parallel to and recessed from the first edge region in the length direction;
    wherein the laser stripe is operable to emit electromagnetic radiation in a wavelength range selected from a first range of about 400 nm to about 435 nm, a second range of about 435 nm to about 480 nm, a third range of about 480 nm to about 505 nm, and a fourth range of about 505 nm to about 550 nm, and wherein the first edge region comprises a first surface-treated region that includes a laser slag material and is configured to interact with the electromagnetic radiation emitted by the laser stripe.

2. The laser diode device of claim 1, wherein the first surface-treated region comprises one of a reflector, an absorber, or a scatterer, and wherein the first facet of the laser stripe is recessed from the first edge region by a length ranging from about 0.5 μm to about 100 μm.

3. The laser diode device of claim 1, wherein the edge regions comprise a second edge region opposite to the first edge region, the second edge region comprising a second surface-treated region, the second facet of the laser stripe being substantially parallel to and recessed from the second edge region in the length direction by a length ranging from about 0.5 μm to about 100 μm.

4. The laser diode device of claim 1, wherein the laser stripe comprises an n-type cladding region overlying the surface region, an active region overlying the n-type cladding region, and a p-type cladding region overlying the active region, and the n-type cladding region and the p-type cladding region are substantially free from aluminum species.

5. The laser diode device of claim 1, wherein the surface region is a surface region of a substrate, and the surface region is characterized by a nonpolar m-plane orientation or an offcut of the non-polar m-plane orientation, wherein the offcut of the nonpolar m-plane orientation is between −5 degrees and +5 degrees toward a c-plane or between −10 degrees and +10 degrees toward an a-plane.

6. The laser diode device of claim 1, wherein the surface region is a surface region of a substrate, and the surface region is characterized by a semipolar plane orientation selected from a (30-3-1) plane, a (30-31) plane, a (20-2-1) plane, a (20-21) plane, a (30-3-2) plane, and a (30-32) plane, or an offcut of the semipolar plane orientation, wherein the offcut of the semipolar plane orientation is between −5 degrees and +5 degrees toward a c-plane or between −10 degrees and +10 degrees toward an a-plane.

7. The laser diode device of claim 1, wherein the surface region is a surface region of a substrate, and the surface region is characterized by a polar c-plane orientation or an offcut of the polar c-plane orientation.

8. The laser diode device of claim 1, wherein the surface region includes a surface of an n-type cladding region.

9. The laser diode device of claim 1, wherein the first facet is an etched facet.

10. The laser diode device of claim 1, wherein the first surface-treated region is operable to interact with the electromagnetic radiation so as to minimize an intensity of the electromagnetic radiation emitted from the first edge region.

11. The laser diode device of claim 1, wherein the laser stripe comprises an n-type cladding region overlying the surface region, an active region overlying the n-type cladding region, and a p-type cladding region overlying the active region, and the first surface-treated region includes a portion of the n-type cladding region.

12. The laser diode device of claim 1, wherein the first surface-treated region includes the entire first edge region.

13. A laser diode device comprising:
    a surface region bounded by edge regions including a first edge region; and
    a laser stripe overlying a portion of the surface region, the laser stripe characterized by a length in a length direction and a width in a width direction, in the length direction the laser stripe includes a first end and a second end opposite the first end, the length direction being substantially orthogonal to the first edge region, and the width direction being substantially parallel to the first edge region;
    wherein the laser stripe forms a ridge that protrudes outward from the surface region and is spaced on all sides from the edge regions by portions of the surface region;
    wherein the first end of the laser stripe comprises a first facet, and the second end of the laser stripe comprises a second facet, the first facet having a primary emission surface, the first facet being substantially parallel to and recessed from the first edge region in the length direction by a length ranging from about 0.5 μm to about 100 μm;
    wherein the laser stripe is operable to emit electromagnetic radiation at a wavelength ranging from about 425 nm to about 485 nm or from about 500 nm to about 550 nm, and wherein the first edge region comprises a first surface-treated region that includes a laser slag material and is configured to interact with the electromagnetic radiation emitted by the laser stripe, the first surface-treated region comprising one of a reflector, an absorber, or a scatterer.

14. The laser diode device of claim 13, wherein the laser stripe comprises an n-type cladding region overlying the surface region, an active region overlying the n-type cladding region, and a p-type cladding region overlying the active region, and the n-type cladding region and the p-type cladding region are substantially free from aluminum species.

15. The laser diode device of claim 13, wherein the edge regions comprise a second edge region opposite to the first edge region, the second edge region comprising a second surface-treated region, and the second facet of the laser stripe is substantially parallel to and recessed from the second edge region in the length direction by a length ranging from about 0.5 μm to about 100 μm.

16. The laser diode device of claim 13, wherein the surface region is a surface region of a substrate, and the surface region is characterized by one of a nonpolar m-plane, a semipolar plane selected from a (30-3-1) plane, a (30-31) plane, a (20-2-1) plane, a (20-21) plane, a (30-3-2) plane, and a (30-32) plane, an offcut of the semipolar plane, or an offcut of the nonpolar m-plane, wherein the offcut is between −5 degrees and +5 degrees toward a c-plane, or between −10 degrees and +10 degrees toward an a-plane.

17. The laser diode device of claim 13, wherein the surface region includes a surface of an n-type cladding region.

18. The laser diode device of claim 13, wherein the first facet is an etched facet.

19. The laser diode device of claim 13, wherein the laser stripe comprises an n-type cladding region overlying the surface region, an active region overlying the n-type cladding region, and a p-type cladding region overlying the active region, and the first surface-treated region includes a portion of the n-type cladding region.

20. The laser diode device of claim 13, wherein the first surface-treated region includes the entire first edge region.

\* \* \* \* \*